United States Patent
Hunger et al.

(10) Patent No.: US 11,742,445 B2
(45) Date of Patent: Aug. 29, 2023

(54) PROCESS OF PREPARING COLORED SOLAR CELLS

(71) Applicant: MERCK PATENT GMBH, Darmstadt (DE)

(72) Inventors: Marc Hunger, Darmstadt (DE); Sebastian Barth, Darmstadt (DE); Laurent Deloux, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 17/732,997

(22) Filed: Apr. 29, 2022

(65) Prior Publication Data

US 2022/0352403 A1 Nov. 3, 2022

(30) Foreign Application Priority Data

Apr. 30, 2021 (EP) .................. 21171471

(51) Int. Cl.
*H01L 31/048* (2014.01)
*H01L 31/049* (2014.01)
*H01L 31/0216* (2014.01)

(52) U.S. Cl.
CPC .... *H01L 31/0481* (2013.01); *H01L 31/02168* (2013.01); *H01L 31/049* (2014.12)

(58) Field of Classification Search
CPC ............. H01L 31/02168; H01L 31/048; H01L 31/0481; H01L 31/049; H01L 31/18
See application file for complete search history.

(56) References Cited

U.S. PATENT DOCUMENTS

| 8,647,429 | B2 | 2/2014 | Melson et al. | |
| 2015/0013766 | A1* | 1/2015 | Nakai | C08K 5/29 |
| | | | | 136/256 |
| 2020/0335643 | A1 | 10/2020 | Hunger et al. | |
| 2021/0043787 | A1 | 2/2021 | Kudo et al. | |
| 2021/0159352 | A1* | 5/2021 | Li | H01L 31/049 |

FOREIGN PATENT DOCUMENTS

| CN | 114103455 A | * 3/2022 |
| WO | 2017090056 A1 | 6/2017 |
| WO | 2019122079 A1 | 6/2019 |

OTHER PUBLICATIONS

Machine translation of CN-114103455-A, Fang Z. (Year: 2022).*
Search report in corresponding EP application 22170173.3 dated Sep. 30, 2022 (pp. 1-7).

* cited by examiner

*Primary Examiner* — Mayla Gonzalez Ramos
(74) *Attorney, Agent, or Firm* — Millen White Zelano and Branigan, PC; Csaba Henter

(57) ABSTRACT

A process for the preparation of colored solar cells or colored solar cell modules containing a colored polymer film with oriented effect pigments, and colored solar cells or colored solar cell modules prepared by this process.

22 Claims, 2 Drawing Sheets

PROCESS OF PREPARING COLORED SOLAR CELLS

The invention relates to a process for the preparation of colored solar cells or colored solar cell modules comprising a colored polymer film with effect pigments, and to colored solar cells or colored solar cell modules prepared by this process.

Solar cells showed a great success over the last years and have surpassed the global grid-connected installation of 600 GW in 2019 with the majority being installed in utility scale. The basic function of all solar cells is the same: A photoactive material absorbs light and generates an excited electron-hole pair. This electron-hole pair is separated within the solar cell by areas with different mobilities for electrons and holes—a so called p-n junction. As different kinds of light absorbing materials can be used, the solar industry knows several different kinds of solar cell technologies:

1) Crystalline silicon solar cells (mono crystalline c-Si and multi crystalline mc-Si)
2) Cadmium-Telluride Solar cells (CdTe)
3) Copper-Indium-Gallium-Diselenide (CIGS/CIS)
4) Amorphous silicon solar cells (a-Si)
5) III/V solar cells like Gallium-Arsenide (GaAs) solar cells or multi-junction solar cells consisting of stacks of group III and group V elements like Germanium/Indium-(Aluminium)-Gallium-Arsenide or phosphide (In(Al)GaAs/P)
6) Dye sensitized solar cells (DSSC)
7) Organic solar cells (OSC)
8) Perovskite solar cells (PSC)
9) Quantum dot solar cells (QSC)
10) Other II/VI solar cells consisting of elements of group II and group VI like Zinkselenide (ZnSe) or Ironsulfide (FeS)
11) Tandem solar cells Nevertheless, using more surfaces e.g. of buildings and other surfaces on objects (e.g. cars) would increase the overall surface areas which could be used for solar energy production. For this purpose, new techniques and approaches to make solar cells with appealing colors and to increase efficiencies under different absorption angles are of major interest for the solar energy business.

WO 2019/122079A1 discloses a method of coloring state of the art single solar cells, or solar cell modules made of a plurality of electrically interconnected solar cells, by incorporating effect pigments into an application medium, like for example a transparent lamination material, which is then subsequently applied to the solar cell module. It is further described in WO 2019/122079A1 that the effect pigments can provide sufficient color when printed on glass or Si or used in EVA (ethylene vinyl acetate copolymer) films without reducing the overall solar cell efficiency significantly.

The effect pigments are reflecting a part of the visible sunlight, but let pass the light needed to create energy. However, since the effect pigments are platelet-shaped, their color reflection will decrease the more the pigment platelets are oriented such that their edges are facing the visual surface of a solar module. Therefore the effect pigments have to be oriented predominantly substantially parallel to the module surface, while a certain random orientation to some extent may still be desirable to maintain a viewing angle related color impression.

The existing state of the art techniques for manufacturing encapsulated solar cell modules do typically include to build a stack of front glass and solar cells mounted with bus bars embedded in encapsulant films laminated to a back sheet or glass. The stack is then heated up e.g. to 130° C. to 160° C. (depending on the type of encapsulant material used) and pressed together by vacuum or any other type of physical pressure.

The components of the final encapsulated solar cell module are exemplarily illustrated in FIG. 1 and include a front sheet (11), a front encapsulant film (12), a pattern or array of solar cells with bus bars (13), a rear encapsulant film (14) and a rear sheet (15). The arrow indicates the direction of the incident light.

However, when a front encapsulant film (12) containing effect pigments is used, it has been observed that after lamination certain areas around the single cells and/or bus bars are appearing darker than other areas.

Without wishing to be bound to a specific theory, it is assumed that the platelet shaped pigments tend to change their orientation from the desired parallel orientation to the film surface to a more orthogonal orientation which leads to reduced color reflection. The disorientation of the pigments can be explained by flowing of the molten polymer and/or shrinkage of the encapsulant film during the lamination process. As a result certain extended patterns of the cells and strings/bus bars in the colored solar cell module remain visible.

This is a drawback which can limit the use of encapsulant films colored by effect pigments in certain areas like facades of buildings or other areas of building integrated photovoltaics.

It is therefore an object of the present invention to provide an improved method for laminating a polymer film containing effect pigments to a solar cell or solar cell module, which does not have the drawbacks observed in prior art methods, and which enables the preparation of colored solar cells or colored solar cell modules with improved color reflection, while avoiding undesired reorientation of the effect pigments during the lamination process. Another object of the present invention is to provide improved colored solar cells or colored solar cell modules prepared by this method.

It was surprisingly found that one or more of these objects could be achieved by providing the methods and solar cells as disclosed and claimed hereinafter.

In particular, it was surprisingly found that, when the lamination process of the solar cell modules is modified such that the polymer film with the effect pigments is laminated to the front sheet in a pre-lamination step, it is possible to reduce or even avoid the undesired reorientation of the effect pigments, and thereby to reduce the appearance of undesired dark patterns of the cells and strings/bus bars in the colored solar cell or solar cell module.

The present application thus relates to a process of preparing colored solar cells or colored solar cell modules comprising the following steps:

a) lamination of a polymer film containing one or more effect pigments to a front sheet, preferably by applying heat and/or pressure, or using an adhesive or a binding agent or layer, preferably in a vacuum press,
b) optionally cooling down the front sheet with the laminated polymer film containing the effect pigments, preferably to room temperature,
c) providing a stack comprising the following layers
   C1) optionally one or more front encapsulant films,
   C2) one or more solar cells, or an array of solar cells which are electrically interconnected by conducting parts, preferably by bus bars,
   C3) optionally one or more rear encapsulant films,
   C4) a rear sheet,
on top of the front sheet with the laminated polymer film containing the effect pigments, or providing the front sheet with the laminated polymer film containing the effect pigments on top of the stack of layers C1 to C4, d) laminating the stack of layers C1 to C4 to the front sheet with the laminated polymer film containing the effect pigments, preferably by applying heat and/or pressure, or using an adhesive or a binding agent, preferably in a vacuum press.

Above and below, the term "front side" of the solar cell or solar cell module means the radiation-receiving side or the side facing incident light, and the term "rear side" or "back side" of the solar cell or solar cell module means the side opposite to the radiation-receiving side or facing away from incident light. The terms "front glass/sheet" or "front encapsulant film" mean the glass, sheet or encapsulant film provided on the front side of the solar cell or solar cell module, and the terms "rear glass/sheet" and "rear encapsulant film" mean the glass, sheet or encapsulant film provided on the rear side of the solar cell or solar cell module.

Above and below, unless stated otherwise the term "solar cell" is understood to encompass both single solar cells and solar cell modules, as well as arrays, strings or patterns of the aforementioned. Likewise the term "solar cell modules" is understood to encompass also single solar cells unless stated otherwise.

The present invention offers a highly efficient method of coloring state of the art solar cells, as well as solar cell modules made of a plurality of electrically interconnected solar cells, with great flexibility and achieving a huge range of different colors with a low or negligible loss in solar cell efficiency, and a high level of long term stability. Additionally, the invention provides a solution to achieve a high color uniformity where the bus bars and in solar cell modules can be blackened so that no single solar cells are visible and at the same time a low or negligible loss of solar cell efficiency is achieved.

In particular, it was surprisingly found that, by modifying the process for manufacturing the solar cell such that the polymer film containing the effect pigments is laminated to the front sheet of the solar cell in a pre-lamination step, above and below also named "step a)", it is possible to reduce or even avoid the appearance of undesired dark patterns of the cells and strings/bus bars in the colored solar cell or solar cell module. It is believed that disorientation of the effect pigments can be reduced or even avoided during the final lamination of the solar cell, since the effect pigments together with the polymer film are pre-fixed to the front sheet, whereas the pre-lamination step itself does not cause such disorientation or does so only to a lesser extent.

It has also been found that effect pigments according to the invention are ideal to give sufficient color, especially when being used in EVA films (ethylene vinyl acetate films) without reducing the overall solar cell efficiency significantly. Long term test showed high level of stability. As the direct contact between the effect pigment-containing film and the solar cell is the most demanding location in the setup of the solar module, no negative effect in any position of the solar module stack can be assumed.

The effect pigments are reflecting a part of the incident visible light, but are letting pass the light needed to create energy by the photovoltaic process. The effect pigments can be orientated such that it is possible to modify the angle of best efficiency and thus to play with color and efficiency.

The polymer film with the effect pigments can easily be applied to state of the art solar cells, making their application even more efficient. Both the pre-lamination step and the process step of applying the front sheet with the laminated polymer film containing the effect pigments to the solar cell module can easily be integrated into the existing state of the art methods to build encapsulated solar cell modules.

By use of the present invention, the visual appearance of solar cells can be adapted to special needs. The exterior visual appearance of objects comprising solar cells such as buildings, devices, automotive, etc. can be improved and transparency and reflectivity of the solar cells can be controlled. Furthermore, visibility of the cells and the bright colored bus bars can be avoided when a dark back sheet is used and the bus bars and connection points are darkened. Also, the invention can be used to provide solar cells with extraordinary colors to achieve special effects and designs, for example depending on the used effect pigment also a texture can be added such as e.g. a sparkle effect on the panels.

Another advantage of the present invention is the possibility to seamlessly integrate solar cells into any surface by changing the appearance to a neutral look which people are used to. The coloration of the solar cells is possible over a variety of colors and not limited to a rigid substrate like glass or a single solar cell technology. Additionally, any complex solutions like additional layers in the lamination stack are not needed.

The effect pigment layers render appearance of solar cells' front surfaces to different colors, like e.g. red, blue, violet, green etc. The thickness of the polymer film, the type of polymer used therein, as well as the concentration of effect pigments or their combination may be varied to achieve the desired color effect.

In particular, the method according to the present invention can be used to seamlessly integrate solar cells into many kinds of surfaces such as buildings (façade and roof), hand hold, portable and installed devices, automotive vehicles (cars, motorcycles, scooters, trucks and similar) or any other highly visible surface that needs a seamless integration of solar cells without changing the optical appearance, or other kinds of solar installations where the typical technical look of solar cells would make a change to the typical appearance people are used to and where long-term stability is essential. Additionally, these improvements can be achieved without significant loss in efficiency of the solar cells.

The colored solar cells can be used in any typically pigmented surface like buildings, communication and transportation objects such as for example cars, trains, trucks, trailers, manual devices, ships, price tags, plastics, wearable items and home appliances or similar.

Additionally, the costs of solar power are not increased in a significant way, because the efficiency of the colored solar cells is not impacted too heavily in contrast to currently available technologies which have the great drawback of an impact on the solar cell performance and where under real life conditions the efficiency of the solar cell may drop below 10% from an initial performance of >15%.

Surprisingly, effect pigments show the possibility to homogeneously color solar cells with a minor impact on cell efficiency if the concentration of the effect pigment is chosen accordingly. It has also surprisingly been found that especially conventional effect pigments such as pearlescent pigments, interference pigments and/or multi-layer pigments show the desired effects. As the working principle of these effect pigments is based on a selected reflection of a specific wavelength area, the color effect can be tuned selectively and the resulting efficiency can be directly correlated to the transmitted portion of light. In general, a desired color-effect can already be obtained at low reflections of a specific wavelength. The performance can even be increased in dedicated wavelength of 700 to 1100 nm detected by some flakes—being important for the quantum efficiency.

The long term stability of the whole system against heat, UV light, humidity and temperature changes has also been tested positively.

The process according to the present invention is now described in more detail.

A preferred solar cell or solar cell module prepared by a process according to the present invention includes

- two outer sheets, above and below also referred to as front and rear sheets, of glass or plastic film like for example TPT (Tedlar®-Polyester-Tedlar®, wherein Tedlar® is a PVF (polyvinylfluoride) film commercially available from DuPont),
- two or more transparent layers of a polymer material, for example a polyolefin, in particular a polyethylene copolymer including but not limited to EVA (ethylene vinyl acetate), EBA (ethylene butyl acrylate), EMA (ethylene methyl acrylate), EEA (ethylene ethyl acrylate), POE (polyolefin elastomer), BPO (a copolymer of ethylene and methyl acrylate or polypropylene commercially available e.g. from Borealis under the name Quentys®), furthermore PVB or TPU (thermoplastic polyurethane), preferably EVA, one of which contains one or more effect pigments, and
- a solar cell or a string or array of electrically interconnected solar cells.

These components are stacked in following sequence: front glass/front polymer film with effect pigments/preferably second polymer film without effect pigments/solar cell(s)/rear polymer film without effect pigments/rear glass or TPT.

Instead of laminating the above stack in one step as proposed in prior art, in the process according to the present invention the polymer (EVA) film containing the effect pigments is laminated to the front sheet in a pre-lamination step (step a).

The pre-lamination step a) can be carried out by using standard methods, e.g. subjecting the two layers to heat and pressure, e.g. by applying a vacuum and/or any other form of physical pressure, for a certain time interval, e.g. in a lamination machine.

Alternatively and/or additionally lamination can be achieved or supported by using one or more adhesives and/or bonding agents or layers. Adhesives/bonding agents can be reactive or non-reactive and can comprise or consist of natural, or synthetic origin. Suitable and preferred examples include, without limitation, polyurethane (PUR), thermoplastic polyurethane (TPU), rubber, acrylic and silicone adhesives, depending on the desired application.

After the pre-lamination step a), in case heat was applied for lamination, the front sheet with the laminated polymer film containing the effect pigments is preferably cooled down in step b), very preferably to room temperature. The polymer film containing the effect pigments is now permanently fixed to the glass and cannot be pulled off by hand. The pigments are evenly distributed on the surface.

In the next step c) the remaining stack of optional front encapsulant, solar cells, optional rear encapsulant, and rear sheet is placed on top of the pre-laminated bilayer of the front glass and the polymer film with the effect pigments, or alternatively the pre-laminated bilayer is placed on top of the remaining stack. Preferably the pre-laminated bilayer is placed such the polymer film with the effect pigments is facing the solar cells.

Then the final lamination of the stack is carried out in step d) under conditions which are preferably similar to those of the pre-lamination step.

In the pre-lamination step a) and final lamination step d), the suitable applied heat and pressure and the time interval depend on the type of sheets and films used and can be easily chosen by the person skilled in the art. In case a front glass sheet and a polymer film of EVA are used, preferably the heating temperature is in the range of 130° C. to 160° C., very preferably 135° C., and the time interval is preferably 20 to 30 minutes. Preferably a vacuum press is used. Preferably a pressure of 400 to 900 mbar is applied.

After the final lamination step d) the laminated stack is cooled down again, preferably to room temperature. Excessive material of the encapsulant films and rear sheets (in case a plastic rear sheet is used) can be cut away and a junction box can be attached for electrical connection of the solar cell module. Finally the laminate can be framed.

Preferably the resulting laminate is completely sealed and, in the ideal case, can protect the solar cells for at least 25 years.

A solar cell module prepared by the process according to a preferred embodiment of the present invention is exemplarily illustrated in FIG. 2 and includes a front sheet (21), which is preferably a glass sheet, a polymer film (22), which is preferably an EVA film, containing the effect pigment(s), a front encapsulant film (23), which is preferably an EVA film, and which does not contain effect pigments or other colorants, an array of solar cells with bus bars (24), a rear encapsulant film (25), which is preferably an EVA film, and a rear sheet (26), which is preferably a TPT film or glass sheet. The arrow indicates the direction of the incident light.

In a preferred embodiment, one or more further encapsulant films (not shown in FIG. 2), are provided between the polymer film (22) with the effect pigments and the solar cells (24), and/or between the solar cells (24) and the rear sheet (26). The further encapsulant film(s) do not contain effect pigments.

In another preferred embodiment the solar cell module does not contain the front encapsulant film (23).

In another preferred embodiment the polymer film (22) containing the effect pigments is serving as encapsulant film.

In another preferred embodiment, a protective foil or an exterior foil (not shown in FIG. 2) is applied on top of the finished solar cell or solar cell module.

The components located at the front side of the solar cell module, like the front sheet (21), the polymer film (22) and the front encapsulant film (23) are substantially transparent to incident light passing through to the solar cell or solar cell array (24).

The front sheet (21) and rear sheet (26) are preferably selected from glass sheets. In another preferred embodiment, the front sheet (21) and/or the rear sheet (26), more preferably the rear sheet (26), is a polymer sheet, preferably a TPT sheet.

Further preferred polymers for use as or in rear sheets can be categorized into double fluoropolymers, single fluoropolymers and non-fluoropolymers and various constructions within each category. Double fluoropolymer rear sheets do typically consist mainly of outer layers of Tedlar® polyvinyl fluoride (PVF) films, or Kynar® polyvinylidene fluoride (PVDF) films, and a core layer of polyethylene terephthalate (PET). Single fluoropolymer rear sheets do typically consist of Tedlar or Kynar® on the air side and PET and primer or EVA layers on the inner side. Non-fluoropolymer rear sheets do typically consist of two PET and one primer or EVA layers.

The solar cell array (24) as exemplarily shown in FIG. 2 may also be replaced by a single solar cell.

The solar cells (24) can be selected from any kind of solar cell technologies including amorphous, mono- and multi crystalline silicon solar cells, CIGS, CdTe, III/V solar cells, II/VI solar cells, perovskite solar cells, organic solar cells, quantum dot solar cells and dye sensitized solar cells, as well as solar cell modules made out of single cells. Crystalline solar cells include cell structures like Al-BSF, PERC, PERL, PERT, HIT, IBC, bifacial or any other cell type based on crystalline silicon substrates.

The rear sheet (26) is preferably black or of a dark color, and/or a black or dark colored sheet like e.g. the rear encapsulant film or an additional encapsulant film is provided at the rear side of the solar cell or solar cell module, i.e. between the solar cells (24) and the rear sheet (26), wherein the dark color is preferably a dark blue equal to the color of solar cells.

In the solar cells (24) the conducting parts preferably comprise metal based conducting parts including but not limited to the following parts:
i) the H-grid consisting of main vertical connectors—so called bus bars,
ii) the horizontal current gathering parts—so called fingers,
iii) connectors and solder between the cells, In a preferred embodiment of the invention, in order to achieve a fully homogeneous appearance of the solar cells (24) the metal based conducting parts, including but not limited to the aforementioned parts i) to iii), are preferably colored black or in a dark color like dark solar blue prior to the application of the polymer film (22) with the effect pigments.

In another preferred embodiment of the invention, a grid of dark color, preferably black or dark blue, is incorporated into one or more layers of the solar cells, said grid covering bright areas like the space between the single solar cells and the conducting parts including bus bars, conducting path and soldering points. In another preferred embodiment of the invention, to hide the space between the single solar cells, a black or dark blue back layer is applied behind the solar cells. The black or dark blue back layer can be printed or applied as a foil.

Suitable and preferred ways of darkening the else white appearing metal parts of the solar cells (24) with a H-grid front pattern include covering the metal stripes with a black polymer foil or brushing the metal parts with a black paint. In the case of a printed silver H-grid the silver can directly be blackened by formation of a thin layer of silver-sulphide (for example by treatment with $H_2S$) or by plating and oxidation of copper. In the case of a plated metal grid the top layer of the metal stack can directly be plated with a strongly absorbing metal oxide or sulphide like CuO or $Ag_2S$ or similar dark colored metal oxides or others. In the case of the usage of novel metallization schemes (like the smart wire technology) blackened wires or wires with a microstructure reducing the reflectance and thus making a dark appearance of the metal grid can also be used according to the invention. If a black or dark solar blue rear sheet is used as module background, a very homogeneous appearance of the whole module even from a close distance can be achieved.

The polymer and encapsulant films are preferably selected from organic polymers including but not limited to polyolefins like for example polyethylene copolymers such as EVA (ethylene vinylacetate), EBA (ethylene butylacrylate), EMA (ethylene methylacrylate), EEA (ethylene ethylacrylate), POE (polyolefin elastomer), BPO, furthermore polyesters, polyamides, polyurethanes, polyvinylbutyral PVB, polycarbonates, polyvinylchloride, polyvinyl acetate, polyacrylates, polyols, polyisocyanates or polyamines, as well as copolymers, resins, blends or multilayers of the aforementioned, such as polycarbonate-containing urethane resins, vinyl chloride-vinyl acetate containing urethane resins, acrylic resins, polyurethane acrylate resins, polyester resins, or TPU (thermoplastic polyurethane).

The front, rear and further encapsulant films preferably contain, very preferably consist of TPU or a polyolefin including but not limited to EVA, EBA, EMA, EEA, POE or BPO, most preferably EVA.

The polymer film (22) containing the effect pigment(s) is located at the radiation-receiving side, i.e. within the visible parts of the solar cells or solar cell modules according to the present invention. It may be located in the solar cell module on the inside of the front sheet (21), i.e. the side facing the solar cell or array of solar cells, as shown in FIG. 2, or alternatively it may be located on the outside of the front sheet (21), i.e. the side facing the incident light.

The polymer film (22) with the effect pigments can be locally and flexibly applied on any surface. Thus, it can be applied on the exterior of a finished solar cell or solar cell module, on the protective substrate covering the solar cell or solar cell module (glass or plastic), or directly on the photoactive material/solar cells.

Advantageously, the polymer film (22) with the effect pigments can also be used as anti-reflective film.

The effect pigments used in the polymer film (22) in accordance with the present invention are preferably transparent or at least semi-transparent. The effect pigments useful for the invention exhibit preferably a green color. However, other colors like blue, grey, white, violet, red, orange, black are also suitable. Other colors or their mixture to produce specific colors and shades can be used. The effect pigments can also produce metallic effects, such as but not limited to: silver, platinum, gold, copper and variety of other metals. It is also possible to create a printed images/pictures using a mixture of different colors.

The effect pigments and/or the polymer film (22) comprising the effect pigments preferably have an overall transparency of at least 30%, more preferably at least 60%, most preferably at least 80%, for radiation relevant for the specific solar cell or solar cell module, preferably for radiation in the range of 260 to 1200 nm, more preferably in the range from 400 to 800 nm.

The effect pigments and/or the polymer film (22) comprising the effect pigments have a selective reflection maximum, preferably with a reflectance of 1 to 40%, more preferably of 1 to 30%, most preferably of 1 to 20%, in the visible part of the solar spectrum, more preferably in the range of 400 to 800 nm. For example a local reflection peak in the range of 450-550 nm with a maximum reflectance selected such that the total reflectance in this range is 5% is sufficient to obtain a strong green color impression of an else optically blue solar cell.

Preferably, the effect pigments and/or the polymer film (22) comprising the effect pigments have an overall reflectance of <40% more preferably <30%, very preferably <20%, most preferably <10%, for radiation for radiation relevant for the specific solar cell or solar cell module, preferably for radiation in the range of 260 to 1200 nm, more preferably in the range from 400 to 800 nm.

Further preferably, the effect pigments and/or the polymer film (22) comprising the effect pigments have a reflection level of <30%, very preferably <20%, most preferably <10% for radiation in the range of 800 to 1000 nm.

Besides their specific color, the encapsulant film (22) comprising the effect pigments shows a high level (at least 30%, preferably >80%) of transparency for radiation relevant for the specific solar cell, preferably for radiation in the range of 260 to 1200 nm and preferably a reflection level total of about 5 to 40%, preferably below 10% in the range of 260 to 1200 nm.

The internal and external quantum efficiency of the solar cells and solar cell modules according to the present invention is preferably >60% (>0.6), preferably >70% (>0.7) and preferably of (≥0,8)≥80% in the area of 260 to 1200 nm wavelength.

The quantum efficiency describes the amount of photons used for electricity generation. The external quantum efficiency (EQE) describes the wavelength selective relation of the amount of total photons shining on the solar cell in correlation to the amount of photons absorbed by the solar cell and efficiently converted into electricity. The internal quantum efficiency (IQE) describes the relation of the amount of photons which arrive in the solar cell and are converted to electricity. In the case of the invention the difference between the internal and external quantum efficiency can be described as follows:

EQE=IQE−reflected photons by the encapsulant film with the effect pigments.

The high level of the both the IQE and EQE thus shows the limited impact of the effect pigments on the solar cell performance. The effect pigments and/or the polymer film (22) comprising the effect pigments create a relative current loss [$A/m^2$] of less than 40%, preferably less than 30%, most preferably less than 20%. Thus, the effect pigments and/or the polymer film (22) comprising the effect pigments create an efficiency reduction [$W/m^2$] of less than 40%, preferable less than 30%, most preferably less than 20%.

Impacts of pigments and layers onto c-Si solar cells can be assessed by reflection data. Reflection data are used to estimate max. power absorption/max. photo current generation of treated cells. Reflection and transmission measurements and calculations are conducted by common methods known to the person skilled in the art and as described further in the experimental section.

A reference with a TPU based encapsulant shows a typical EQE of 90% over a wide wavelength, an effect pigment mixture according to the invention leading to a white/grey appearance of the solar cell shows a drop by ~7% and a green effect pigment according to the invention based on coated glass flakes shows an averaged drop below 5% and even an increase of the quantum efficiency in the IR region.

The effect pigments preferably have a flake-form substrate which comprises at least one coating comprising a metal oxide, metal oxide hydrate or mixtures thereof. Preferably, the effect pigments consist of transparent or semi-transparent, colorless, flake-form substrates, which have been coated with one or more layers of transparent or semi-transparent, colorless materials. Preference is given to the use of pearlescent pigments, interference pigments, and/or multi-layer pigments. Long term stability of the effect pigments can preferably be improved with using a post coating of organic coatings and/or inorganic coatings as last layers of the effect pigments as described for example in WO 2011/095326 A1 and below.

Suitable substrates for the effect pigments are, for example, all known coated or uncoated, flake-form substrates, preferably transparent or semi-transparent, preferably colorless flakes. Suitable are, for example, phyllosilicates, in particular synthetic or natural mica, glass flakes, $SiO_2$ flakes, $Al_2O_3$ flakes, $TiO_2$ flakes, liquid crystal polymers (LCPs), holographic pigments, BiOCl flakes or mixtures of the said flakes. Aluminum flakes with dielectric coatings can also be used according to the invention at low concentrations to obtain a very high hiding power of the active photovoltaic layer.

The glass flakes can consist of all glass types known to the person skilled in the art, for example of A glass, E glass, C glass, ECR glass, recycled glass, window glass, borosilicate glass, Duran® glass, labware glass or optical glass. The refractive index of the glass flakes is preferably 1.45 to 1.80, in particular 1.50-1.70. Especially preferred glass flakes consist of A glass, C glass, E glass, ECR glass, quartz glass and borosilicate glass.

Preference is given to coated or uncoated flakes of synthetic or natural mica, $SiO_2$ flakes, $Al_2O_3$ flakes, and glass flakes, in particular glass flakes of C glass, ECR glass or calcium aluminum borosilicate. Especially, effect pigments based on calcium aluminum borosilicate glass are preferably used. In a variant of the invention $Al_2O_3$ flakes are preferred.

The substrates generally have a thickness of between 0.01 and 5 µm, in particular between 0.05 and 4.5 µm and particularly preferably from 0.1 to 1 µm. The length or width dimension is usually from 1 to 500 µm, preferably from 1 to 200 µm and in particular from 5 to 125 µm. They generally have an aspect ratio (ratio of mean diameter to mean particle thickness) of from 2:1 to 25,000:1, preferably from 3:1 to 1000:1 and in particular from 6:1 to 250:1. The said dimensions for the flake-form substrates in principle also apply to the coated effect pigments used in accordance with the invention, since the additional coatings are generally in the region of only a few hundred nanometers and thus do not significantly influence the thickness or length or width (particle size) of the effect pigments.

The particle size and the particle size distribution of the effect pigments and their substrates can be determined by various methods usual in the art. However, use is preferably made of the laser diffraction method in a standard process by means of a Malvern Mastersizer 2000, Beckman Coulter, Microtrac, etc. In addition, other technologies such as SEM (scanning electron microscope) images can be used.

In a preferred embodiment, the substrate is coated with one or more transparent or semitransparent layers comprising metal oxides, metal oxide hydrates, metal hydroxides, metal suboxides, metal fluorides, metal nitrides, metal oxynitrides or mixtures of these materials. Preferably, the substrate is partially or totally encased with these layers.

Furthermore, multilayered structures comprising high- and low-refractive-index layers may also be present, where high- and low-refractive-index layers preferably alternate. Particular preference is given to layer packages comprising a high-refractive-index layer (refractive index≥2.0) and a low-refractive-index layer (refractive index<1.8), where one or more of these layer packages may have been applied to the substrate. The sequence of the high- and low-refractive-index layers can be matched to the substrate here in order to include the substrate in the multilayered structure.

Particular preference is given to metal oxides, metal oxide hydrates or mixtures thereof, preferably of Ti, Sn, Si, Al, Zr and Zn, especially of Ti, Sn and Si. Oxides and/or oxide hydrates may be present in a single layer or in separate layers. Particularly, titanium dioxide, in the rutile or anatase modification, preferably in the rutile modification is used. For conversion of titanium dioxide into the rutile modification, a tin dioxide layer is preferably applied beneath a titanium dioxide layer. Preferred multi-layer coatings comprise alternating high- and low-refractive-index layers, preferably such as $TiO_2$—$SiO_2$—$TiO_2$.

The layers of metal oxides, hydroxide and/or oxide hydrates are preferably applied by known wet-chemical methods, where the wet-chemical coating methods developed for the preparation of effect pigments, which result in enveloping of the substrate, can be used. After the wet-chemical application, the coated products are subsequently separated off, washed, dried and preferably calcined.

The thickness of the individual layers thereof is usually 10 to 1000 nm, preferably 15 to 800 nm, in particular 20 to 600 nm, especially 20 to 200 nm.

In order to increase the light, temperature, water and weather stability, the effect pigment may be subjected to post-coating or post-treatment. The post coating may be an organic coating and/or an inorganic coating as last layer/s. Post coatings preferably comprising one or more metal oxide layers of the elements Al, Si, Zr, Ce or mixtures or mixed phases thereof. Furthermore, organic or combined organic/inorganic post-coatings are possible. Silanes and/or organofunctional silanes may also be used, alone or in combination with metal oxides. Suitable post-coating or post-treatment methods are, for example, the methods described in DE 22 15 191, DE-A 31 51 354, DE-A 32 35 017 or DE-A 33 34 598, EP 0090259, EP 0 634 459, WO 99/57204, WO 96/32446, WO 99/57204, U.S. Pat. Nos. 5,759,255, 5,571,851, WO 01/92425, WO 2011/095326 or other methods known to the person skilled in the art man.

Effect pigments which can be used for the invention are, for example, the commercially available interference pigments or pearlescent pigments offered under the trade names Iriodin®, Pyrisma®, Xirallic®, Miraval®, Colorstream®, RonaStar®, Biflair®, and Lumina Royal®. Other commercially available effect pigments may also be used. Especially, Colorstream®, Xirallic®, Miraval®, and Ronastar® pigments may be used.

The polymer film (22) may also comprise a mixture of different effect pigments, since in many cases the use of at least two different effect pigments makes it possible to obtain special effects. In that case the effect pigments can be mixed in any proportion, although the overall content of all effect pigments in the polymer film (22) should not exceed 60% by weight.

The concentration of the effect pigments in the polymer film (22) is preferably in the range of 0.1 to 40%, preferably 0.1 to 20% by weight. More preferably, the concentration of the effect pigments in the polymer film (22) is in the range of 0.1 to 15% by weight, particularly in the range of 0.2 to 10%, most preferably 0.2 to 8% by weight.

Unless stated otherwise, above and below the weight percentages of the effect pigments are based on the total weight of the solid part of the encapsulant film.

The amount of effect pigments in the polymer film (22) in grams per $m^2$ is defined by the film thickness. For example a 20 μm thick film with 1% effect pigments in the formulation based on the binder medium would translate into ~0.4 g effect pigment per $m^2$ while a 100 μm thick film with 12% effect pigment would translate into ~18 g effect pigment per $m^2$. The general range of effect pigment per $m^2$ of the treated solar surface thus is in the range of 0.1 $g/m^2$ for thin films (1 μm) and low concentrations up to 75 $g/m^2$ for high concentrations in thick films (200 μm). The preferred amount is in the range of 0.2 to 30 $g/m^2$, preferably 1 to 15 $g/m^2$, especially preferably 1 to 6 $g/m^2$.

The effect pigments can be incorporated into the polymer film (22) for example by extrusion methods that are known to the person skilled in the art.

In extrusion, thermoplastics are melted to a viscous mass in a screw and then pressed into shape through a nozzle. The variety of possible shapes is huge. Films, foils, and plates are extruded through flat nozzles. Nozzles with larger openings are used for solid rods, tubes, or flat profiles.

Sheet/film extrusion is used to extrude plastic sheets or films that are too thick to be blown. Two types of dies can be used: T-shaped and coat hanger. The purpose of these dies is to reorient and guide the flow of polymer melt from a single round output from the extruder to a thin, flat planar flow. Both die types ensure constant, uniform flow across the entire cross sectional area of the die. Cooling is typically by pulling through a set of cooling rolls (calender or "chill" rolls). In sheet extrusion, these rolls not only deliver the necessary cooling but also determine sheet thickness and surface texture. Often co-extrusion is used to apply one or more layers on top of a base material to obtain specific properties such as improved mechanical properties, UV-absorption, texture, oxygen permeation resistance, or energy reflection.

Masterbatches or compounds are usually used to color the molten mass with effect pigments. For a satisfactory result in plastic extrusion with effect pigments, a balanced ratio must be maintained between the mixture energy and pigments that are as undamaged as possible. Excessive shear from mixing sections or inappropriate screws or filters destroy effect pigments and dramatically decrease the pearl luster effect. The orientation of the pigments is critical for an even effect. This has to be ensured in the process through corresponding engineering and design of the machinery.

In a preferred embodiment of the present invention a masterbatch comprising the desired amount, e.g. 20% by weight, of the effect pigment in the polymer material is added to the extrusion process of the polymer film. This can be done for example by creating a premix of the colored masterbatch pellets with the EVA pelets, or by any other known methods.

Due to the shear forces acting upon the effect pigments during the melt extrusion process the effect pigments are oriented substantially parallel to the encapsulant film surface.

In another preferred embodiment, the polymer film containing one or more effect pigments is a co-extruded film of two or more layers of the same or different polymer materials wherein one layer, preferably the layer facing the front sheet, contains one or more effect pigments.

In case such a two-layer film is used, the front encapsulant film (23) can be, and is preferably, omitted.

EVA, employed as an encapsulant for the lamination of PV modules, is a thermosetting polymer of which the formulation is especially adapted for an exposure to photo oxidative stress. Common EVA formulations typically comprise, besides the polymer resin, a crosslinking agent, an adhesion promoter, a UV absorber, a UV stabilizer, and antioxidant agents. The crosslinking agent is a radical initiator—usually a peroxide—which decomposes under heat during the lamination and will form free radicals that initiate radicals on the polymeric backbone. The formed radicals will in turn lead to the formation of covalent bonds between the polymer chains.

The layer thickness of the polymer film (22) containing the effect pigments before the pre-lamination step is preferably in the range of 5 μm to 1000 μm, more preferably 20 μm to 800 μm, even more preferably 100 μm to 400 μm.

After the pre-lamination the film thickness will usually be reduced depending on the lamination conditions.

The following examples are intended to explain the present invention without restricting it.

EXAMPLE 1

Preparation of Encapsulant Film with Effect Pigments

An encapsulant EVA film containing 1 g/m² of the effect pigment Iriodin® 7235 Ultra Rutile Green Pearl and other additives is prepared as follows:

Different masterbatches containing the different additives are prepared separately to avoid more flexibility in the formulations:

A masterbatch of EVA containing 10% of Iriodin® 7235 Ultra Rutile Green Pearl is produced as granules in a classical extrusion process. 2.5% of this masterbatch is used to produce the EVA encapsulant film.

The second masterbatch of EVA containing 5% triallyl isocyanurate (TAIL cross-linking co-agent), 2.5% 3-Methacryloxypropyltrimethoxysilane (VMMS, silane glass-coupling agent), 3% Tinuvin 770 (HALS, UV stabilizer) and 7% Cyasorb UV 531 UV absorber) is produced as granules in a classical extrusion process. 10% of this masterbatch is used to produce the EVA encapsulant film.

The third masterbatch of EVA containing 10% tert-Butylperoxy 2-ethylhexylcarbonat (Luperox® TBEC, peroxide cross-linking agent) is produced as granules in a classical extrusion process. The extrusion temperature is kept low, so that no cross-linking reaction is happening at this stage (<120° C.).

The different masterbatches are added (2.5% of pigment masterbatch, 10% of the additive masterbatch and 10% of the peroxide masterbatch) and are mixed with colorless EVA granules and fed into a hopper into the heated nozzle of a state of the art film extrusion line. An EVA film is produced with a thickness of 0.40 mm. The extrusion temperature is kept low, so that no cross-linking reaction is happening at this stage (<120° C.).

Preparation of Encapsulant Film without Effect Pigments

The film is made in a similar way, but no masterbatch containing effect pigments is used.

a) Pre-lamination

The encapsulant EVA film with the effect pigment Iriodin® 7235 Ultra Rutile Green Pearl is put on top of a front glass sheet with a thickness of 4000 μm and lateral dimensions of 40×40 cm as conventionally used for solar modules. The EVA film is then laminated to the glass sheet in a vacuum press at 145° C. and a pressure profile of lamination of 20 seconds 400 mbar/20 seconds 700 mbar/650 seconds 900 mbar. During lamination the EVA film is covered with a Teflon textile film and a glass plate on top to avoid sticking to the surface of the membrane and to assure a plane pressing and even temperature distribution.

b) Cooling

After pre-lamination step a), the front glass sheet with the laminated EVA film containing the effect pigments is cooled to room temperature.

c+d) Module Lamination

Using the front glass sheet prepared in steps a) and b) with the laminated EVA film containing the effect pigments facing inside, the following stacks are built:

1. Front glass pre-laminated with EVA film containing green effect pigments/colorless EVA film/solar cells with bus bars/colorless EVA film/black EVA film/glass.
2. Front glass pre-laminated with EVA film containing green effect pigments/colorless EVA film/solar cells with bus bars/colorless EVA film/black TPT film/colorless EVA film/glass.
3. Front glass pre-laminated with EVA film containing green effect pigments/colorless EVA film/solar cells with bus bars/black EVA film/glass.
4. Front glass pre-laminated with EVA film containing green effect pigments/colorless EVA film/solar cells with bus bars/colorless EVA film/black TPT film.

The stacks 1-4 are placed in a classical lamella laminator with pins and lamella pressure adaptable via control of vacuum level in upper chamber where a top lamella and a hot plate can be heated up.

The stacks 1-4 are placed in one run side by side into the laminator and the stacks are treated at 145° C. with the pressure profile for lamination of 20 seconds 400 mbar/20 seconds 700 mbar/650 seconds 900 mbar. After lamination the modules are cooled to room temperature.

A visual inspection shows no pattern appearing after lamination.

COMPARISON EXAMPLE 1

Using an encapsulant EVA film containing 1 g/m² of the effect pigment Iriodin® 7235 Ultra Rutile Green Pearl prepared as described in Example 1, and a separate front glass sheet, the following stacks are built.

1. Front glass/EVA film containing green effect pigments/colorless EVA film/solar cells with bus bars/colorless EVA film/EVA film black/glass.
2. Front glass/EVA film containing green effect pigments/colorless EVA film/solar cells with bus bars/colorless EVA film/black TPT film/colorless EVA film/glass.
3. Front glass/EVA film containing green effect pigments/colorless EVA film/solar cells with bus bars/black EVA film/glass.
4. Front glass/EVA film containing green effect pigments/colorless EVA film/solar cells with bus bars/colorless EVA film/black TPT film.

The stacks 1-4 are placed in a classical lamella laminator with pins and lamella pressure adaptable via control of vacuum level in upper chamber where a top lamella and a hot plate can be heated up.

The stacks 1-4 are placed in one run side by side into the laminator and the stacks are treated at 145° C. with the pressure profile for lamination of 20 seconds 400 mbar/20 seconds 700 mbar/650 seconds 900 mbar. After lamination the modules are cooled to room temperature.

Results

FIG. 3 shows the solar cell module prepared in accordance with Comparison Example 1, Stack 2.

FIG. 4 shows the solar cell module prepared in accordance with Example 1, Stack 2.

It can be seen that the module prepared by the process according to Comparison Example 1 without the pre-lamination step a) shows a clearly visible pattern (FIG. 3) while the module prepared by the process according to Example 1 with the pre-lamination step a) does not show this pattern (FIG. 4).

For the solar modules prepared in accordance with the process of Example 1 containing the pre-lamination step, a climate chamber damp heat 1000 test (as described in: http://sinovoltaics.com/learning-center/testing/damp-heat-test/) shows no impact on the long-term stability.

The results demonstrate that the method according to the present invention enables highly efficient coloring of solar cell modules made of a plurality of electrically interconnected solar cells with a high level of long term stability, whilst reducing the appearance of undesired dark patterns of the cells and bus bars.

Figure 1:
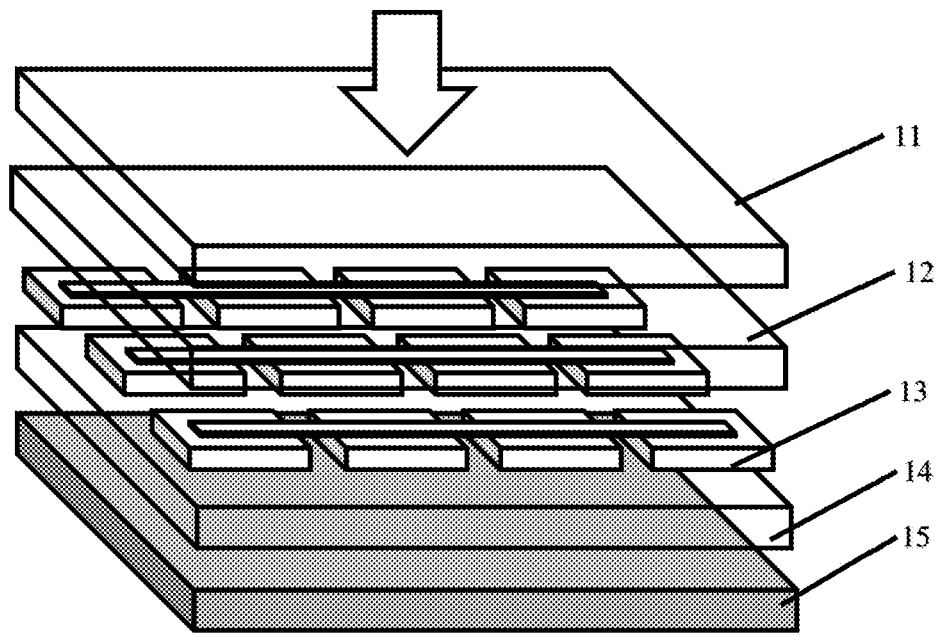
FIG. 1 exemplarily illustrates the components of the final encapsulated solar cell module.
Figure 2:
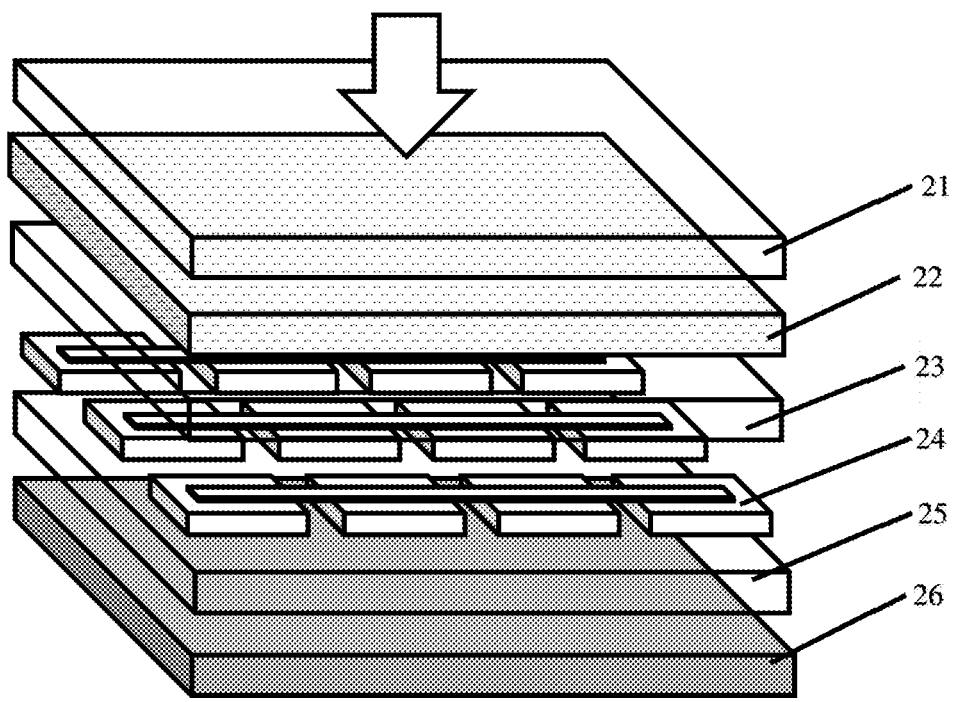
FIG. 2 exemplarily illustrates a solar cell module prepared by the process according to a preferred embodiment.
Figure 3:
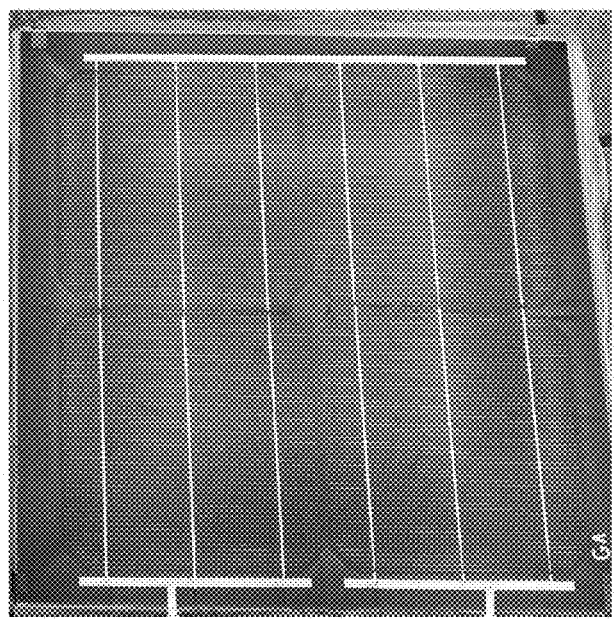
FIG. 3 shows the solar cell module prepared in accordance with comparison example 1, stack 2.
Figure 4:
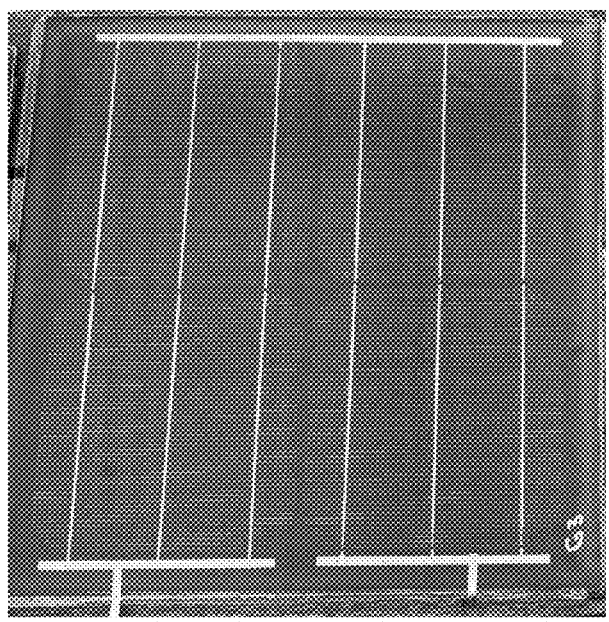
FIG. 4 shows the solar cell module prepared in accordance with example 1, stack 2.

The preceding examples can be repeated with similar success by substituting the generically or specifically described reactants and/or operating conditions of this invention for those used in the preceding examples.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever. From the description, one skilled in the art can easily ascertain the essential characteristics of this invention and, without departing from the spirit and scope thereof, can make various changes and modifications of the invention to adapt it to various usages and conditions.

The entire disclosures of all applications, patents and publications, cited herein and of corresponding EP Patent Application No. 21171471.2, filed Apr. 30, 2021, are incorporated by reference herein.

The invention claimed is:

1. A process of preparing a colored solar cell or colored solar cell module comprising the following steps:
   a) a first lamination step of lamination of a polymer film containing one or more effect pigments to a front sheet forming a laminated bilayer,
      wherein the polymer film containing the effect pigments has been prepared by melt extrusion of an organic polymer material, wherein the effect pigments are added to the polymer melt before extrusion,
      wherein the effect pigments are transparent or semi-transparent, colorless, flake-form substrates, which have been coated with one or more layers of transparent or semi-transparent, colorless materials, and which effect pigments are reflecting only a part of the incident visible light,
   b) optionally cooling down said laminated bilayer,
   c) providing a stack of layers comprising the following layers:
      C1) optionally one or more front encapsulant films,
      C2) one or more solar cells, or an array of solar cells which are electrically interconnected by conducting parts,
      C3) optionally one or more rear encapsulant films,
      C4) a rear sheet,
      on top of said laminated bilayer,
      or
      providing said laminated bilayer on top of said stack of layers,
   d) a second distinct lamination step of laminating said stack of layers to said laminated bilayer.

2. The process according to claim 1, wherein said stack of layers comprises a front encapsulant film between the polymer film containing the effect pigments and the solar cell(s) or solar cell array, wherein said front encapsulant film does not contain effect pigments.

3. The process according to claim 1, wherein the rear sheet has a black or dark color and/or said stack of layers comprises an additional sheet or an encapsulant film provided between the solar cell(s) or solar cell array and the rear sheet, wherein said additional sheet or encapsulant film is black or has dark color.

4. The process according to claim 1, wherein the conducting parts interconnecting the solar cells are colored black or in a dark color prior to the application of the polymer film with the effect pigments.

5. The process according to claim 1, wherein a grid of dark color is incorporated into the solar cell(s) or solar cell array, said grid covering bright areas including but not limited to the space between the solar cells and the conducting parts.

6. The process according to claim 1, wherein the polymer film containing the effect pigments and the front and back encapsulant films are selected from the group consisting of polyolefin films, polyethylene copolymer films, EVA films, EBA films, EMA films, EEA films, POE films, BPO films, PVB films, and TPU films.

7. The process according to claim 1, wherein the front sheet and/or the back sheet is a glass sheet.

8. The process according to claim 1, wherein the front sheet and/or the back sheet is a polymer sheet.

9. The process according to claim 1, wherein the solar cells or solar cell modules are selected from the group consisting of amorphous silicon solar cells, mono-silicon solar cells, multi crystalline silicon solar cells, CIGS-solar cells, CdTe-solar cells, III/V-solar cells, II/VI-solar cells, perovskite solar cells, quantum dot solar cells, organic solar cells and dye sensitized solar cells.

10. The process according to claim 1, wherein the lamination steps a) and d) are carried out by applying heat and/or pressure, or using an adhesive or a binding agent or layer optionally in a vacuum press.

11. The process according to claim 1, wherein in the lamination steps a) and d) the heating temperature is 130° C. to 160° C.

12. The process according to claim 1, wherein the effect pigments and/or the polymer film containing the effect pigments have a selective reflection maximum in the visible range of the solar spectrum.

13. The process according to claim 1, wherein the effect pigments and/or the polymer film containing the effect pigments have an overall transparency of at least 60% for radiation in the range of 260 to 1200 nm.

14. The process according to claim 1, wherein the effect pigments and/or the polymer film containing the effect pigments have an overall reflectance of <40% for radiation in the range of 260 to 1200 nm.

15. The process according to claim 1, wherein the effect pigments are selected from the group consisting of pearlescent pigments, interference pigments and multi-layer pigments.

16. The process according to claim 1, wherein the effect pigments are based on synthetic or natural mica, flake-form glass substrates, flake-form $SiO_2$ substrates or flake-form $Al_2O_3$ substrates.

17. The process according to claim 16, wherein the effect pigments are based on flake-form substrates, which are coated with one or more layers of metal oxides and/or metal oxide hydrates of Ti, Sn, Si, Al, Zr and/or Zn.

18. The process according to claim 1, wherein the amount of effect pigments in the polymer film is 0.2 to 40% by weight.

19. The process according to claim 1, wherein the thickness of the polymer film containing the effect pigments is 5 to 1000 µm.

20. The process according to claim 1, wherein the polymer film containing the effect pigments is a co-extruded film of two or more layers, one of which contains the effect pigments.

21. A colored solar cell or colored solar cell module prepared by a process according to claim 1.

22. The process according to claim 1, wherein the polymer film containing the effect pigments is a co-extruded film of two or more layers, one of which contains the effect pigments, and wherein the stack of layers does not contain a front encapsulant film.

\* \* \* \* \*